US010586913B2

(12) United States Patent
Park et al.

(10) Patent No.: US 10,586,913 B2
(45) Date of Patent: Mar. 10, 2020

(54) ELECTROACTIVE ACTUATOR, MECHANICAL DEVICE INCLUDING THE SAME, AND POLYMER ELECTROLYTE

(71) Applicant: POSTECH ACADEMY-INDUSTRY FOUNDATION, Pohang-si (KR)

(72) Inventors: Moon Jeong Park, Pohang-si (KR); Onnuri Kim, Pohang-si (KR)

(73) Assignee: POSTECH ACADEMY-INDUSTRY FOUNDATION, Pohang-si (KR)

(*) Notice: Subject to any disclaimer, the term of this patent is extended or adjusted under 35 U.S.C. 154(b) by 332 days.

(21) Appl. No.: 15/666,079

(22) Filed: Aug. 1, 2017

(65) Prior Publication Data

US 2018/0047889 A1    Feb. 15, 2018

(30) Foreign Application Priority Data

Aug. 11, 2016 (KR) .......................... 10-2016-0102379
Mar. 28, 2017 (KR) .......................... 10-2017-0039441

(51) Int. Cl.
*H01L 41/193* (2006.01)
*H01L 41/113* (2006.01)
*H01L 41/09* (2006.01)
*F03G 7/00* (2006.01)
*B01J 39/20* (2006.01)
*C08F 293/00* (2006.01)

(52) U.S. Cl.
CPC ............ *H01L 41/193* (2013.01); *B01J 39/20* (2013.01); *C08F 293/00* (2013.01); *F03G 7/005* (2013.01); *H01L 41/094* (2013.01); *H01L 41/0986* (2013.01); *H01L 41/1136* (2013.01)

(58) Field of Classification Search
CPC . H01L 41/193; H01L 41/0986; H01L 41/1136
See application file for complete search history.

(56) References Cited

U.S. PATENT DOCUMENTS

| 7,259,495 B2 | 8/2007 | Asai et al. |
| 9,368,709 B2 | 6/2016 | Brokken et al. |
| 2010/0035158 A1 | 2/2010 | Kato et al. |
| 2010/0201227 A1 | 8/2010 | Choi et al. |

FOREIGN PATENT DOCUMENTS

| CN | 101536114 | 9/2007 |
| EP | 1323925 | 7/2003 |
| JP | 2008251697 | 10/2008 |

(Continued)

OTHER PUBLICATIONS

Chainika Jangu, et al., "Imidazole-containing triblock copolymers with a synergy of ether and imidazolium sites", J. Mater. Chem. C, (2015), vol. 3, pp. 3891-3901.

(Continued)

*Primary Examiner* — Derek J Rosenau
(74) *Attorney, Agent, or Firm* — Cantor Colburn LLP

(57) ABSTRACT

An electroactive actuator includes a polymer electrolyte and an electrode configured to apply an electric field to the polymer electrolyte, the polymer electrolyte includes a self-assembled block copolymer including a conductive block and a non-conductive block, a compound to form a single ion conductor with the self-assembled block copolymer, and a zwitterion. A mechanical device including the electroactive actuator and a polymer electrolyte are also disclosed.

20 Claims, 11 Drawing Sheets

(56) References Cited

FOREIGN PATENT DOCUMENTS

KR  1020140132538  11/2014
WO  2012032443  3/2012

OTHER PUBLICATIONS

Evan Margaretta, et al., "Imidazolium-Containing ABA Triblock Copolymers as Electroactive Devices", ACS Appl. Mater. Interfaces, (2016), vol. 8, pp. 1280-1288.

Naohiro Terasawa, et al., "A multi-walled carbon nanotube/polymer actuator that surpasses the performance of a single-walled carbon nanotube/polymer actuator", Carbon, vol. 50, (2012), pp. 311-320.

Naohiro Terasawa, et al., "Superior performance hybrid (electrostatic double-layer and faradaiccapacitor) polymer actuators incorporating noble metal oxides andcarbon black", Sensors and Actuators B, vol. 210, (2015), p. 748-755.

Ravi Shankar, et al., "Triblock Copolymer Organogels as High-Performance Dielectric Elastomers", Macromolecules, (2008), vol. 41, pp. 6100-6109.

Renlong Gao, et al., "Imidazolium sulfonate-containing pentablock copolymer-ionic liquid membranes for electroactive actuators", J. Mater. Chem., vol. 22, (2012), pp. 13473-13476.

Satoru Imaizumi, et al., "Polymer Actuators Using Ion-Gel Electrolytes Prepared by Self-Assembly of ABA-Triblock Copolymers", Macromolecules, (2012), vol. 45, pp. 401-409.

Satoru Imaizumi, et al., "Printable Polymer Actuators from Ionic Liquid, Soluble Polyimide, and Ubiquitous Carbon Materials", ACS Appl. Mater. Interfaces, (2013), vol. 5, pp. 6307-6315.

Evan Margaretta et al., "Imidazolium-Containing ABA Triblock Copolymers as Electroactive Devices", ACS Applied Materials & Interfaces, vol. 8, No. 2, (Jan. 5, 2016), pp. 1280-1288.

Extended European Search Report—European Patent Application No. 17184208.1 dated Jan. 2, 2018.

Onnuri Kim et al, "Fast low-voltage electroactive actuators using nanostructured polymer electrolytes", Nature Communications, vol. 4 (Jul. 30, 2013), pp. 1-10.

Tianyu Wu et al., "Influence of Zwitterions on Thermomechanical Properties and Morphology of Acrylic Copolymers: Implications for Electroactive Applications", Macromdlecules, vol. 44, No. 20, (Oct. 25, 2011), pp. 8056-8063.

Bartolome Soberats, et al., "Zwitterionic liquid crystals as 1D and 3D lithium ion transport media", J. Mater. Chem. A, (2015), 3, 11232-11238.

Churat Tiyapiboonchaiya, "The zwitterion effect in high-conductivity polyelectrolyte materials", Nature Materials, vol. 3, (Jan. 2004), pp. 29-32.

Onnuri Kim, et al., "One-volt-driven superfast polymer actuators based on single-ion conductors", Nature Communications, (Nov. 18, 2016), pp. 1-8.

Tianyu Wu, et al., "RAFT Synthesis of ABA Triblock Copolymers as Ionic Liquid-Containing Electroactive Membranes" ACS Appl. Mater. Interfaces, (2012), vol. 4, pp. 6552-6559.

[FIG. 1]
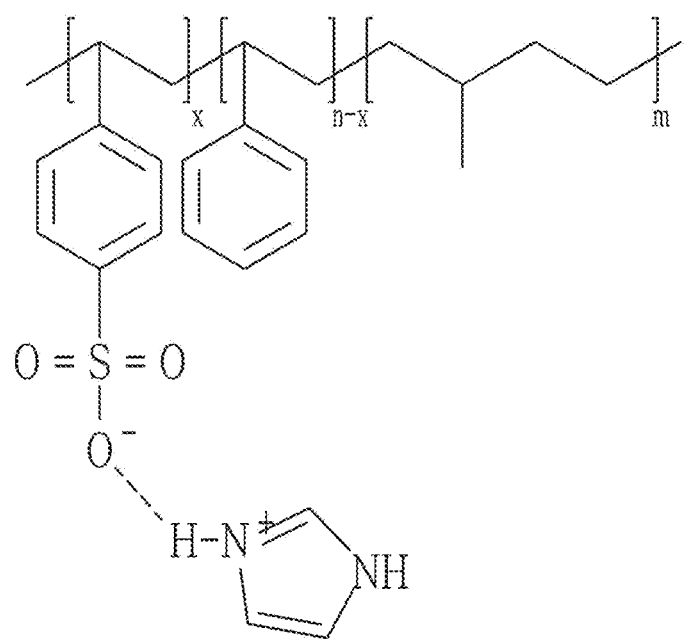
[FIG. 2]
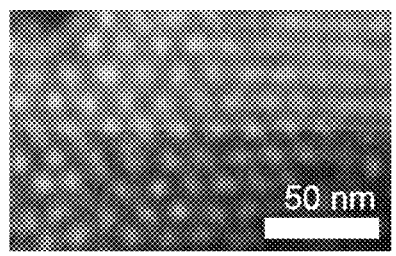

[FIG. 3]
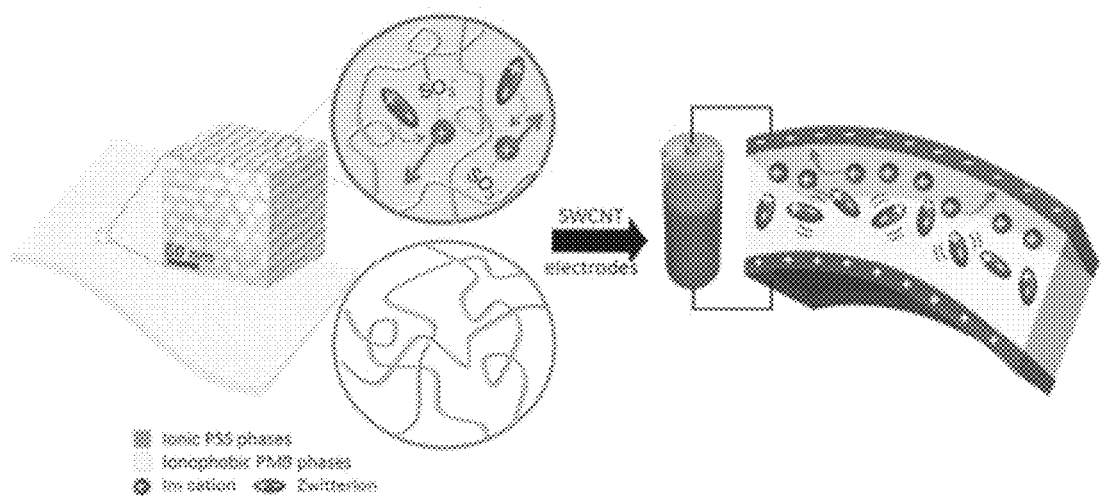
[FIG. 4]
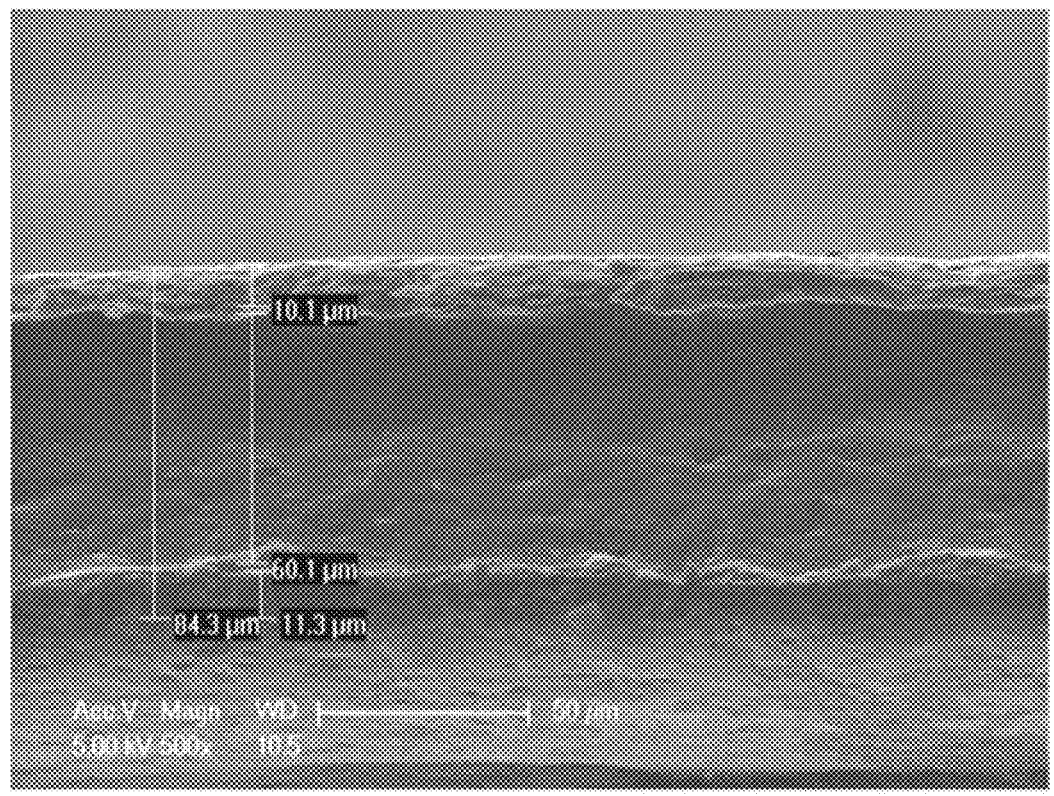

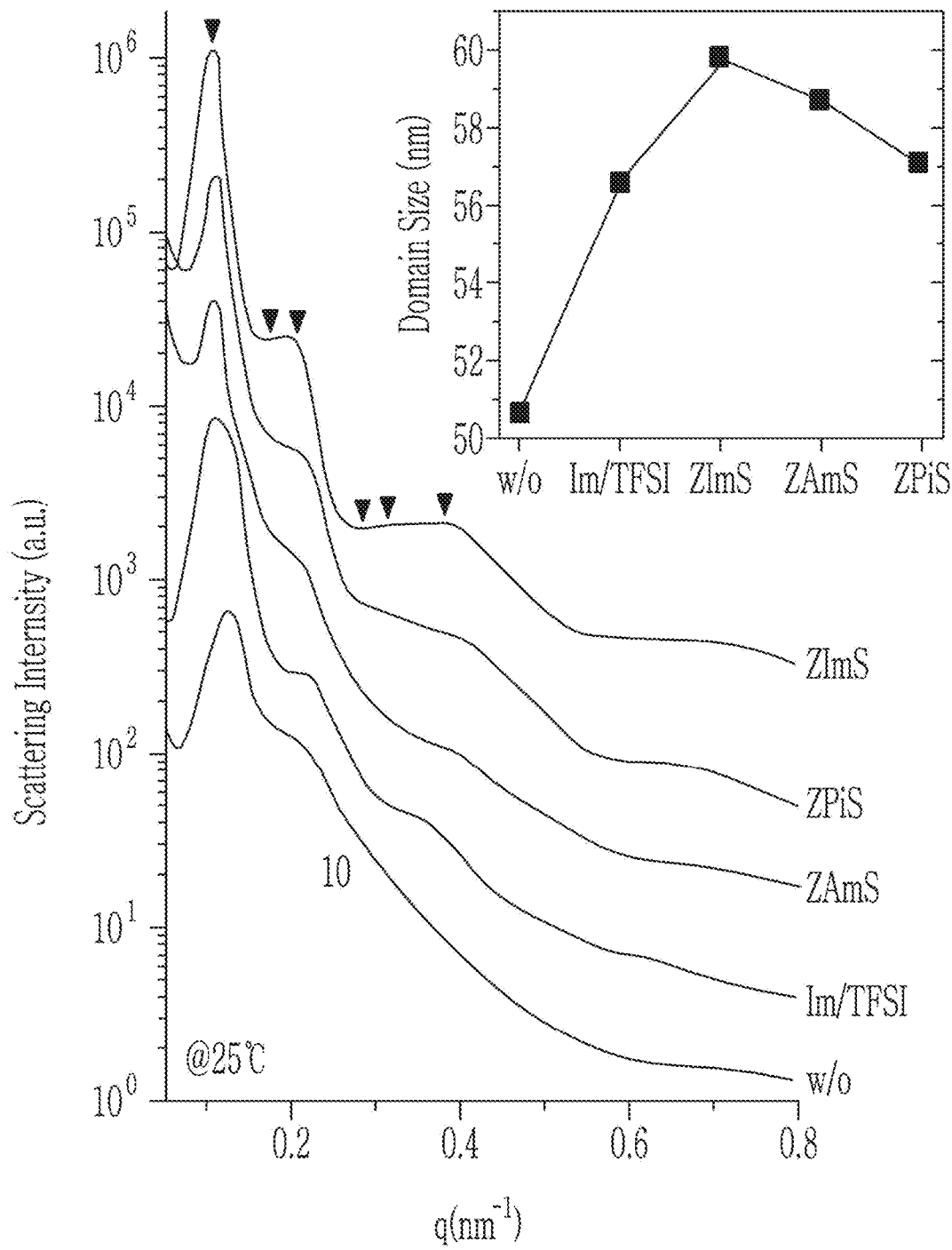
[FIG. 5]

[FIG. 6]
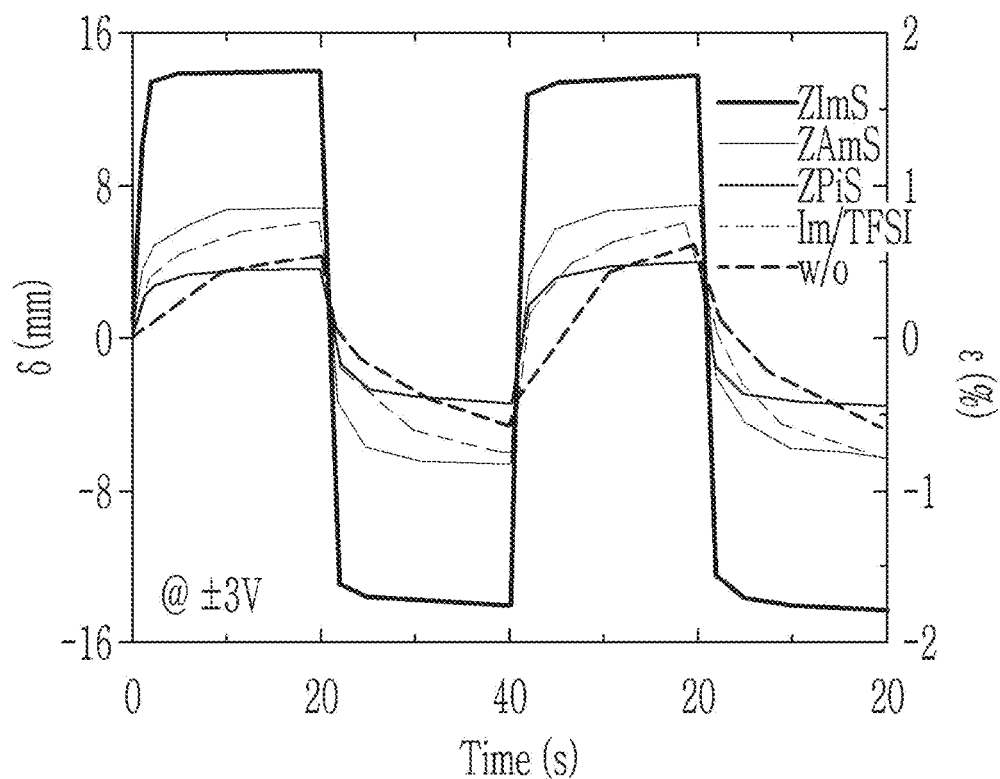
[FIG. 7]
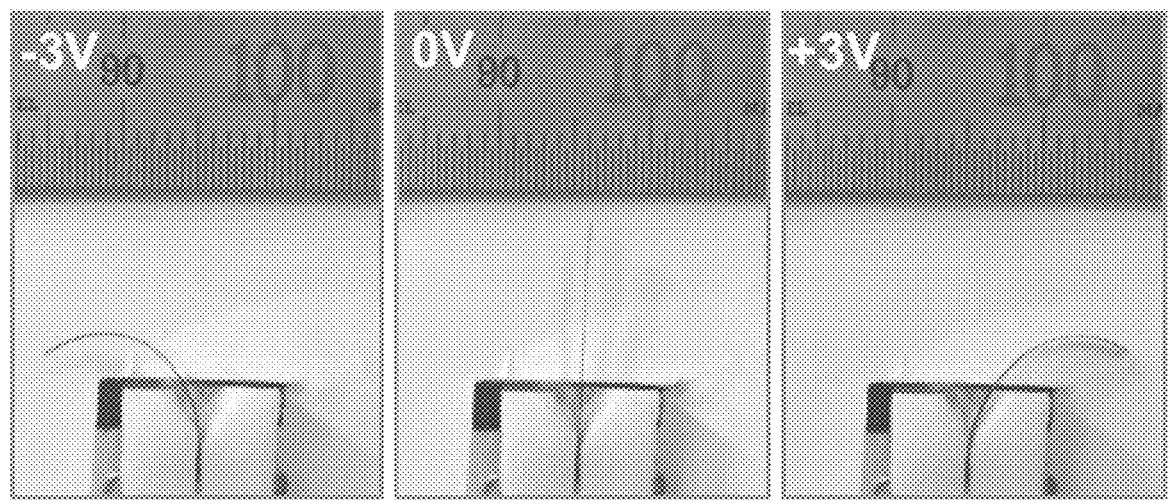

[FIG. 8]
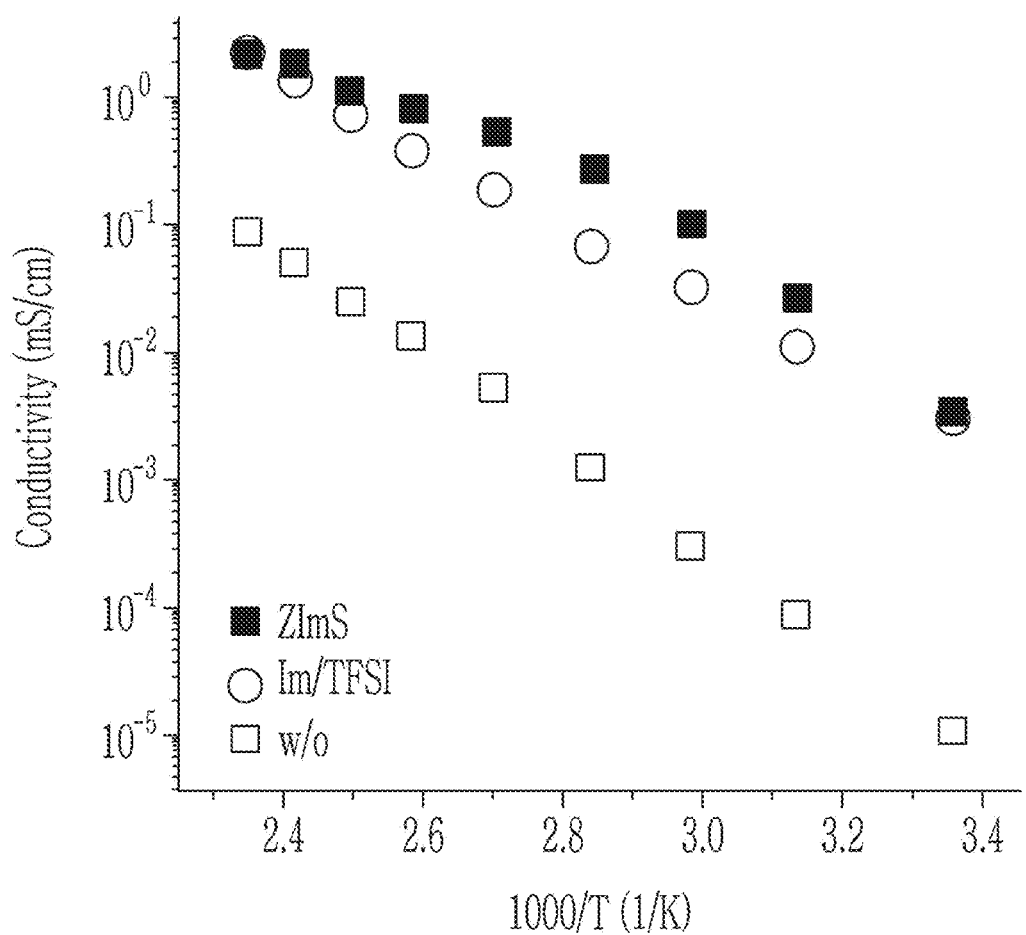

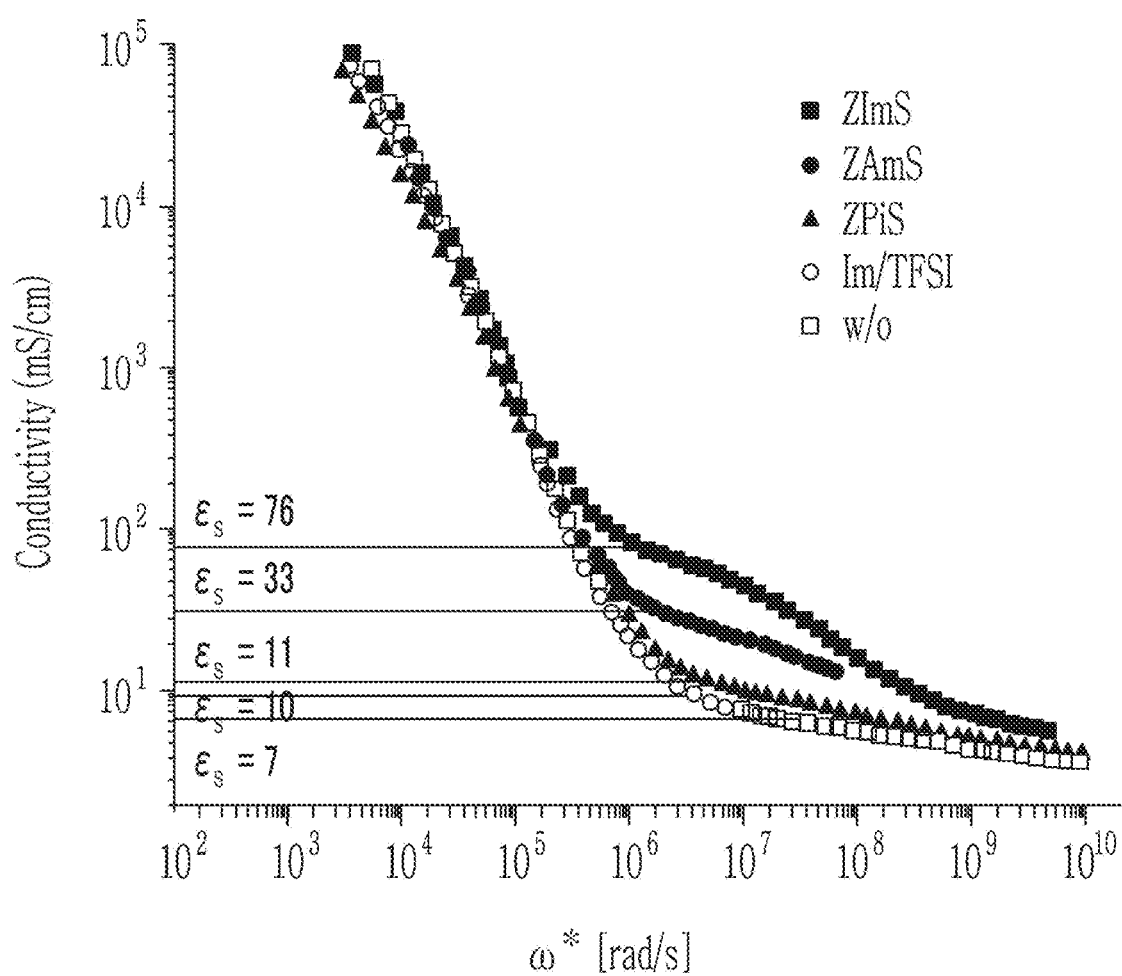
[FIG. 9]

[FIG. 10]
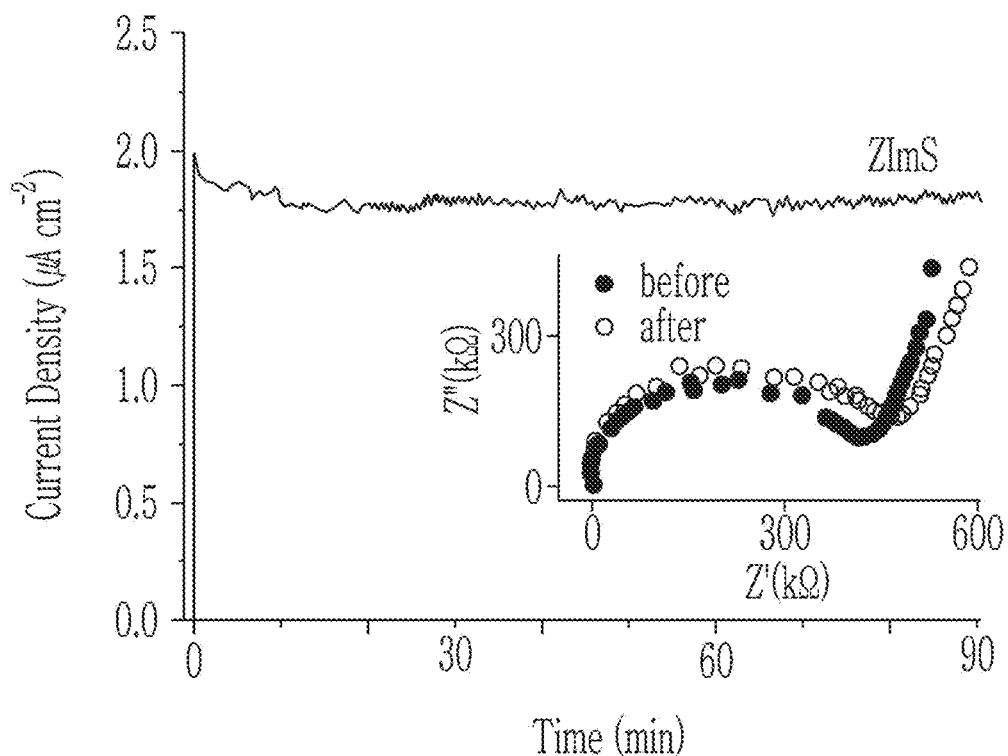
[FIG. 11]
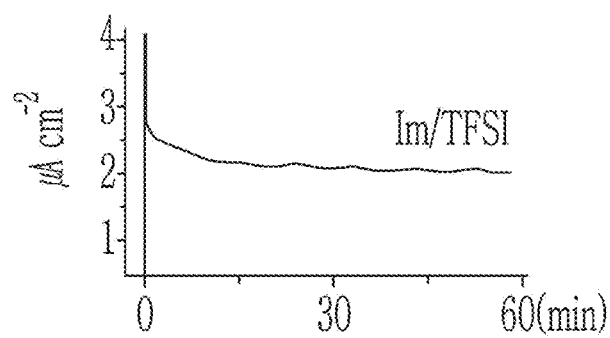

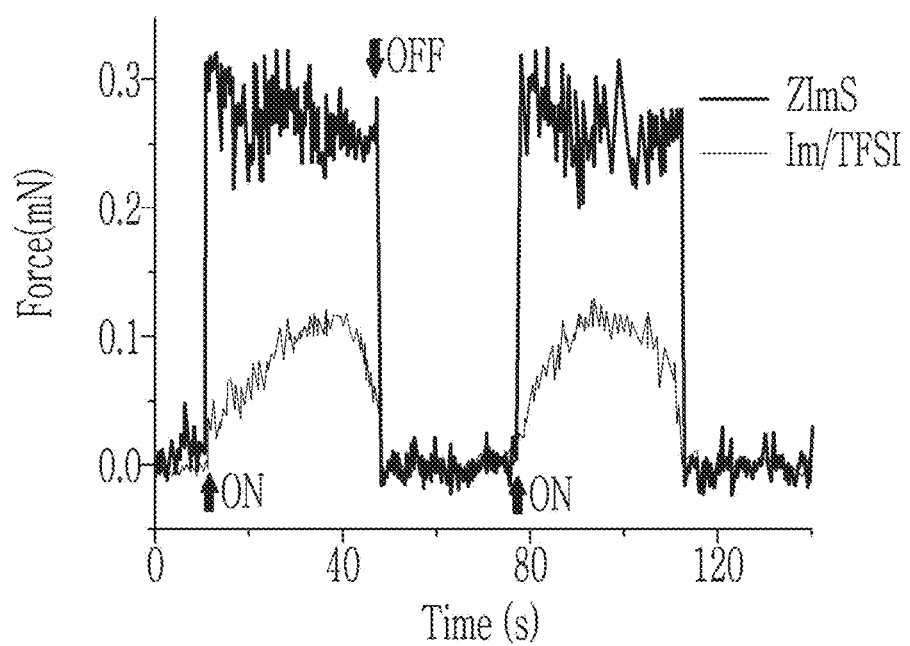
[FIG. 12]

[FIG. 13]
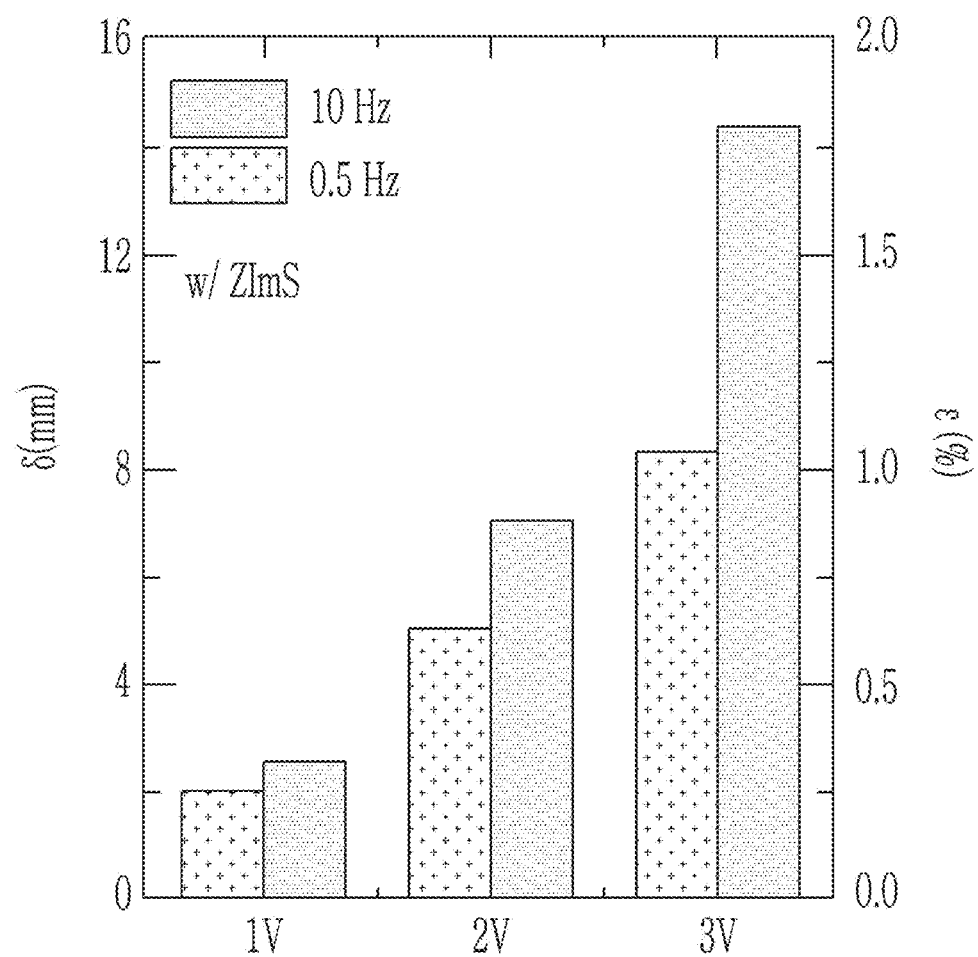

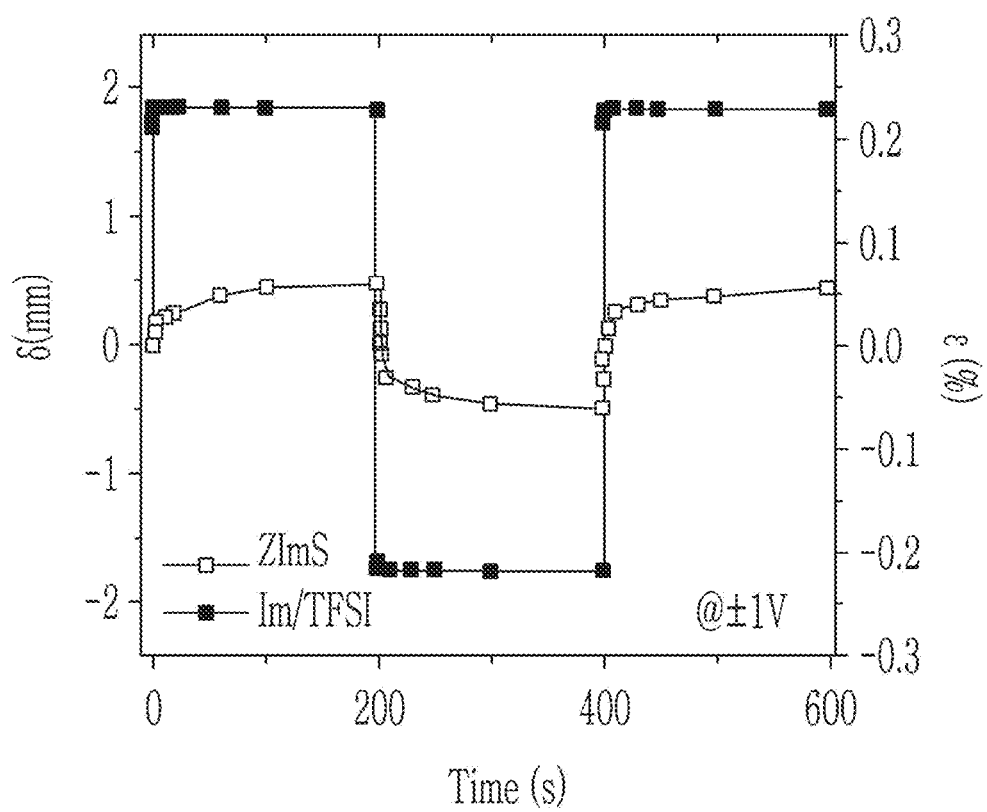
[FIG. 14]

[FIG. 15]
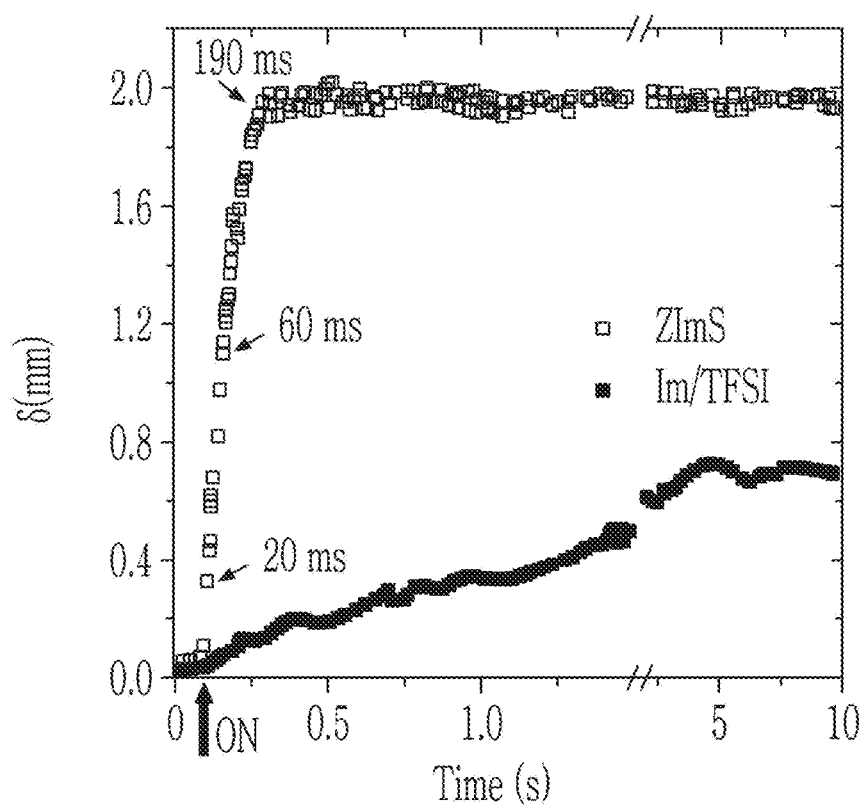
[FIG. 16]
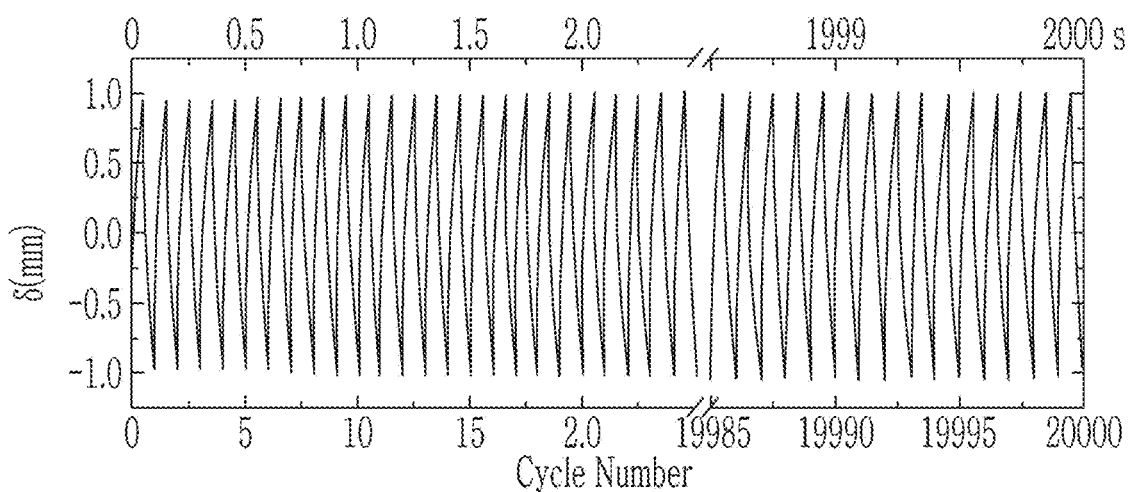

ELECTROACTIVE ACTUATOR, MECHANICAL DEVICE INCLUDING THE SAME, AND POLYMER ELECTROLYTE

RELATED APPLICATIONS

This application claims priority to and the benefit of Korean Patent Application Nos. 10-2016-0102379 and 10-2017-0039441 filed in the Korean Intellectual Property Office on Aug. 11, 2016, and Mar. 28, 2017, the entire contents of which are incorporated herein by reference.

BACKGROUND

1. Field

An electroactive actuator, a mechanical device including same, and a polymer electrolyte are disclosed.

2. Description of the Related Art

An electroactive actuator showing reversible mechanical movements by responding electricity is highly applicable for a bio-mimic technology such as robotics, a micro sensor, an artificial muscle, and the like. Particularly, an ionic polymer actuator which is one of the electroactive actuators draws attentions for a low weight, an excellent flexibility, a high mechanical strength, an easy and low-cost manufacturing process, and the like.

Important requirements for the ionic polymer actuator are a huge operating motion, a quick reactivity, a driving performance in a low voltage, and a stability in the air. However, the conventional actuators have problems in that the operation property is considerably deteriorated in a low voltage, and the response is too delayed to be employed for a bio-mimic device. In addition, as many actuators have a limit to the electrochemical stability at the driving voltage, the motion of the actuator is rapidly deteriorated on the longtime operation.

Therefore, it is continuously required for an actuator having a higher performance.

SUMMARY

An embodiment relates to an electroactive actuator having a quicker response speed and a higher reactivity at a low driving voltage.

Another embodiment relates to a mechanical device including the electroactive actuator having a quicker response speed and a higher reactivity at a low driving voltage.

Further another embodiment relates to a polymer electrolyte having a high dielectric constant so having a high cation dissociation rate.

An embodiment provides an electroactive actuator including a polymer electrolyte and an electrode configured to apply an electric field to the polymer electrolyte, wherein the polymer electrolyte includes a self-assembled block copolymer including a conductive block and a non-conductive block, a compound to form a single ion conductor with the self-assembled block copolymer, and a zwitterion.

The self-assembled block copolymer may have a lamellar (LAM) structure, a hexagonal cylinder (HEX) structure, a gyroid (GYR) hexagonal cylinder (HEX) structure, a gyroid (GYR) structure, or a combination thereof.

The self-assembled block copolymer may have a hexagonal cylinder structure.

The self-assembled block copolymer may include styrene blocks of which at least a part is sulfonated, as the conductive block.

A degree of sulfonation of the styrene block may be greater than or equal to about 10 mol % based on total moles of the structural units of the styrene block.

The self-assembled block copolymer may include a block including an alkylene repeating unit as the non-conductive block.

Each conductive block of the self-assembled block copolymer may have a weight average molecular weight of about 10 kg/mol to about 100 kg/mol.

The compound to form a single ion conductor with the self-assembled block copolymer may be a compound represented by Chemical Formula 1, Compound represented by Chemical Formula 2, or a combination thereof:

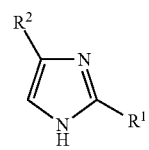

(Chemical Formula 1)

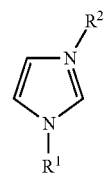

(Chemical Formula 2)

In Chemical Formula 1 and Chemical Formula 2, $R^1$ and $R^2$ are independently hydrogen or a C1 to C30 linear or branched alkyl group.

The zwitterion may include a sulfonic acid group as an anion component.

The zwitterion may be represented by Chemical Formula 3:

$$R^3\text{-}L^1\text{-}X \quad \text{(Chemical Formula 3)}$$

In Chemical Formula 3,
$R^3$ is represented by any one of Chemical Formulae 3-1 to 3-4,

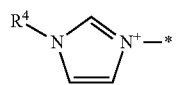 (Chemical Formula 3-1)

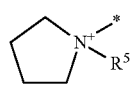 (Chemical Formula 3-2)

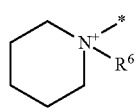 (Chemical Formula 3-3)

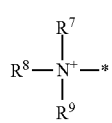 (Chemical Formula 3-4)

In Chemical Formulae 3-1 to 3-4,
$R^4$ to $R^9$ are independently a substituted or unsubstituted C1 to O10 linear or branched alkyl group,
$L^1$ is a C1 to C30 alkylene group, a C2 to C30 alkenylene group including at least one double bond, or a C2 to C30 alkynylene group including at least one triple bond, and
X is $SO_3^-$, $PO_3^-$, or $COO^-$.

The zwitterion may be at least one represented by Chemical Formula 4 to Chemical Formula 6:

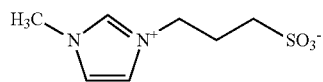 (Chemical Formula 4)

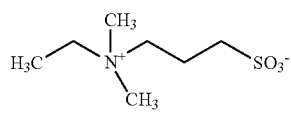 (Chemical Formula 5)

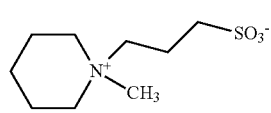 (Chemical Formula 6)

The compound to form the single ion conductor with the self-assembled block copolymer and the zwitterion may be included in a mole ratio of about 1:3 to about 3:1 in the polymer electrolyte.

The polymer electrolyte may have a dielectric constant of greater than or equal to about 10.

The polymer electrolyte may have a form of a polymer thin film.

The electrode configured to apply an electric field to the polymer electrolyte may be a single wall carbon nanotube (SWCNT) electrode, a multi-walled carbon nanotube (MW-CNT) electrode, a PEPOT:PSS (poly(3,4-ethylenedioxythiophene) polystyrene sulfonate) conductive polymer electrode, a metal electrode, or a combination thereof.

Another embodiment provides a mechanical device having a fast response speed and a high reactivity at a low driving voltage.

The mechanical device may be a sensor or an artificial muscle.

Another embodiment provides a polymer electrolyte including a self-assembled block copolymer including a conductive block and a non-conductive block, a compound to form a single ion conductor with the self-assembled block copolymer, and a zwitterion, wherein a dielectric constant of the polymer electrolyte is greater than or equal to about 10.

The self-assembled block copolymer may include styrene blocks of which at least a part is sulfonated, as the conductive block and a block including an alkylene repeating unit as the non-conductive block and may have at least one structure selected from a lamellar (LAM) structure, a hexagonal cylinder (HEX) structure, a gyroid (GYR) hexagonal cylinder (HEX) structure, and a gyroid (GYR) structure.

The compound to form a single ion conductor with the self-assembled block copolymer may be a compound represented by Chemical Formula 1, a compound represented by Chemical Formula 2, or a combination thereof:

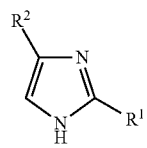 (Chemical Formula 1)

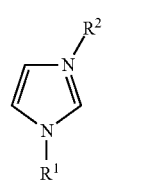 (Chemical Formula 2)

In Chemical Formula 1 and Chemical Formula 2,
$R^1$ and $R^2$ are independently hydrogen or a C1 to O30 linear or branched alkyl group.

Since the electroactive actuator according to an embodiment has a quick response speed within several tens milliseconds and a displacement of greater than or equal to several millimeters at a low driving voltage of less than or equal to 1V, it may be employed for a small device, a micro sensor, an artificial muscle or the like requiring a quick response speed and a large displacement at a low driving voltage.

BRIEF DESCRIPTION OF THE DRAWINGS

FIG. 1 is a schematic view showing that the sulfonated self-assembled block copolymer and imidazole included in the electroactive actuator according to an embodiment are present in a form of a single ion conductor.

FIG. 2 is a TEM image of a polymer electrolyte formed in a membrane according to an Example.

FIG. 3 is a schematic view showing that single wall carbon nanotube (SWCNT) electrodes are conjugated onto both surfaces of the polymer electrolyte membrane obtained from an Example to provide an actuator.

FIG. 4 is a SEM (Scanning Electromicroscope) image showing a cross section of the actuator obtained from an Example.

FIG. 5 shows small-angle X-ray scattering (SAXS) graphs of the polymer electrolyte (w/o) including a self-assembled block copolymer and imidazole (control), the polymer electrolyte (Im/TFSI) including a self-assembled block copolymer and an ionic liquid Im/TFSI (Comparative Example), and the polymer electrolytes (ZImS, ZAmS, ZPiS) including a self-assembled block copolymer, imidazole, and each of three kinds of zwitterions (Examples 1 to 3), respectively.

FIG. 6 shows graphs of displacements ($\delta$) and bending strains ($\epsilon$) of actuators including each of the polymer electrolyte (w/o) including a self-assembled block copolymer and imidazole (control), the polymer electrolyte (Im/TFSI) including a self-assembled block copolymer and ionic liquid Im/TFSI (Comparative Example), and the polymer electrolytes (ZImS, ZAmS, ZPiS) including a self-assembled block copolymer, imidazole, and each of three kinds of zwitterions (Examples 1 to 3), respectively.

FIG. 7 is a photograph showing how an actuator is bent by applying AC square-wave voltage of ±3V, as shown in FIG. 6, wherein the actuator includes a polymer electrolyte of ZImS including a self-assembled block copolymer, imidazole, and zwitterion (Example 1).

FIG. 8 shows ion conductivity graphs of the polymer electrolytes according to the control, Comparative Example (Im/TFSI), and Example 1.

FIG. 9 shows graphs of dielectric constants of the polymer electrolytes according to the control, Comparative Example (Im/TFSI), and Example 1 to 3, respectively, wherein each electrostatic charge dielectric constant $\epsilon_s$ is marked in a solid line.

FIG. 10 is a current density profile of the polymer electrolyte including zwitterion ZImS according to Example 1, and the interposed diagram is a Nyquist diagram obtained before and after the polarization of the electrolyte.

FIG. 11 is a current density profile of the polymer electrolyte including ionic liquid Im/TFSI according to the Comparative Example.

FIG. 12 shows graphs comparing the power outputs of the actuator including the polymer electrolyte according to Example 1 and the actuator including the polymer electrolyte according to Comparative Example 1.

FIG. 13 shows graphs of displacements ($\delta$) and bending strains ($\epsilon$) of the actuator including the polymer electrolyte according to Example 1 at an AC square-wave voltage from ±1V to ±3V and a low frequency of 0.5 Hz and a high frequency of 10 Hz.

FIG. 14 shows graphs comparing displacements ($\delta$) and bending strains ($\epsilon$) of the actuator including ZImS according to Example 1 and of the actuator including Im/TFSI according to Comparative Example at an AC square-wave voltage of ±1V.

FIG. 15 shows graphs of displacements of the actuator including ZImS according to Example 1 and the actuator including Im/TFSI according to Comparative Example measured by a laser displacement sensor when applying 1V.

FIG. 16 shows a cycle period of the actuator including the polymer electrolyte (ZImS) according to Example 1 at ±1V and 10 Hz.

DETAILED DESCRIPTION

The electroactive actuator showing reversible mechanical movements by responding electricity is highly applicable for a bio-mimic technology such as robotics, a micro sensor, an artificial muscle, and the like. An ionic polymer actuator which is one of the electroactive actuators draws a lot of attentions for a low weight, an excellent flexibility, a high mechanical strength, an easy and low-cost manufacturing process, and the like. As the actuator is worked while ions having opposite charges are transported to each electrodes by the electrochemical reaction when applying electric field in the ionic polymer actuator, the ion transporting properties in the polymer electrolyte and the electrochemical stability are important factors for determining the actuator performance. The polymers which have been researched for the actuator may include a poly(vinylidene fluoride) (PVdF)-based polymer, a conjugated polymer, a polymer consisting of perfluorinated ionomers randomly including acidic moieties (eg. Nafion™), and the like.

The most important properties in the ionic polymer actuator are a big working motion, a quick responsibility, a driving performance at a low voltage, and a stability in the air. However, the conventional actuators have problems in that the driving performance is significantly deteriorated at a low voltage and the responsibility is too delayed to be employed for a bio-mimic device. In addition, as many actuators have a limit to the electrochemical stability at the driving voltage, the movements of the actuator are rapidly deteriorated on the longtime operation.

For example, the conventional actuator shows the performance of only moving about 0.3 millimeters (mm) in about 0.1 second and moving about 12 mm in about 1 second at a low voltage of less than about 1V, which is insufficient for an artificial muscle requiring further faster response speed within several tens milliseconds (ms) and a displacement of several mm at a low driving voltage of less than or equal to about 1 V.

In order to solve the problems, a method of probing ionic liquid into a polymer in the actuator has been suggested. Ionic liquid is hardly volatile and has a high ion conductivity and also has excellent electrochemical stability. Terasawa group reports that the probing ionic liquid provides an actuator with excellent performances at a wide ranged driving voltage. (Terasawa, N., Asaka, K., Superior performance hybrid (electrostatic double-layer and faradaic capacitor) polymer actuators incorporating noble metal oxides and carbon black. Sens. Actuators B: Chem. 210, 748-755 (2015); Terasawa, N., Ono, N., Mukai, K., Koga, T., Higashi, N. Asaka, K. A multi-walled carbon nanotube/polymer actuator that surpasses the performance of a single-walled carbon nanotube/polymer, actuator, Carbon 50, 311-320 (2012)).

Meanwhile, Long, Spontak, Colby, Watanabe et al., have reported that the actuator made from a self-assembled block copolymer shows more developed electrochemical driving performance compared to the conventional actuator made by the commercially available polymer. The actuator including a polymer electrolyte having a nano structure shows similar performance to the actuator made of PVdF or PVdF-based polymer or the like, and particularly, the polymer actuator having nano structure may reduce the driving voltage. (Gao, R., Wang, D., Heflin, J. R. & Long, T. E. Imidazolium sulfonate-containing pentablock copolymer-ionic liquid membranes for electroactive actuators, J. Mater. Chem. 22, 13473-13476 (2012); Margaretta, E. Fahs, G. B., Inglefield Jr, D. L., Jangu, C., Wang, D., Hefiln, J. R., Moore, R. B. & Long T. E. Imidazolium-Containing ABA Triblock Copolymers as Electroactive Devices, ACS Appl. Mater. Interfaces 8, 12801288 (2016); Shankar, R., Krishnan, A. K., Ghosh, T. K. & Spontak, R. J. Triblock copolymer organogels as high-performance dielectric elastomers, Macromolecules 41, 6100-6109 (2008); Jangu, C., Nang, J. H. H., Wang, D. Fahs, G. Heflin, J. R., Moore, R. B., Colby, R. H. & Long T. E. Imidazole-containing triblock copolymers with a synergy of ether and imidazolium sites, J. Mater. Chem. C3, 3891-3901 (2015); Imaizumi; S., Kokubo, H. & Watanabe, M. Polymer actuators using ion-gel electrolytes prepared by self-assembly of ABA-triblock copolymers, Macromolecules 45 (1), 401-409 (2012); Imaizumi, S., Ohtsuki, Y., Yasuda, T., Kokubo, H. & Watanabe, M. Printable polymer actuators from ionic liquid, soluble polyimide and ubiquitous carbon materials; ACS Appl. Mater. Interfaces 5; 63076315 (2013)).

However, in spite of the attempts, the conventional electroactive actuator usually shows back relaxation, in which the actuator is returned to the original state and relaxed in a reverse direction when applying electric field; and has a difficulty to operate at a high frequency since it has a low strain and a low response speed at a low voltage of below about 1V.

As the results of the inventors' efforts, the problems of the conventional art are solved, and an electroactive actuator has been developed to show the further faster response speed, for example, within several tens milliseconds at a low driving voltage, for example, less than or equal to about 1 V; and a high reactivity, for example, a displacement of several millimeters.

Thereby, an embodiment provides an electroactive actuator including a polymer electrolyte and an electrode configured to provide an electric field to the polymer electrolyte, wherein the polymer electrolyte includes an electrolyte including a self-assembled block copolymer including a conductive block and a non-conductive block, a compound to form a single ion conductor with the self-assembled block copolymer, and zwitterion.

The self-assembled block copolymer may form a self-assembled nanostructure by the thermodynamic immiscibility between the conductive block and the non-conductive block, wherein the self-assembled nanostructure may include a lamellar (LAM) structure, a hexagonal cylinder (HEX) structure, gyroid (GYR) hexagonal cylinder (HEX) structure, or a gyroid (GYR) structure or the like. In one embodiment, the self-assembled nanostructure may have a hexagonal cylinder structure in which ionic channels are connected to each other to facilitate cations to transport easily.

The conductive block in the self-assembled block copolymer may act as an ionic path, and the conductive block for forming the ionic path may include a styrene block of which at least a part is sulfonated.

The sulfonated styrene block may have for example a degree of sulfonation of the styrene block of greater than or equal to about 10 mol %, greater than or equal to about 20 mol %, greater than or equal to about 25 m %, greater than or equal to about 30 mol %, greater than or equal to about 35 mol %, greater than or equal to about 40 mol, greater than or equal to about 45 mol %, greater than or equal to about 50 mol %, greater than or equal to about 55 mol %, greater than or equal to about 60 mol %, greater than or equal to about 65 mol %, greater than or equal to about 70 mol %, greater than or equal to about 75 mol %, greater than or equal to about 85 mol %, or greater than or equal to about 90 mol % so that a consecutive ionic path is made in a sulfonated polystyrene region. By adjusting the degree of sulfonation within the range, it may control an integrated degree of cation, for example, imidazolium ion in the electrolyte and thus may control the ion conductivity.

The self-assembled block copolymer may include a block including an alkylene repeating unit as a non-conductive block. When a block including an alkylene repeating unit is included as non-conductive block, it may improve the mechanical strength of the self-assembled block copolymer.

In an example embodiment, the self-assembled block copolymer may include a sulfonated polystyrene block and a polymethylbutylene block.

The amounts of the conductive block and the non-conductive block of the self-assembled block copolymer are not particularly limited, but may be determined within the range enough that the self-assembled block copolymer provides the self-assembled nanostructure. In addition, the ratio of the structural unit including a functional group providing a conductivity in the conductive block may be determined within a range enough to provide an appropriate ion conductivity in the electrolyte. For example, the conductive block and the non-conductive block may be included at a ratio of 1 mole to about 3 mole of the structural unit for the non-conductive block relative to 1 mole of the structural unit for the conductive block, for example, at a ratio of 1 mole to about 2 mole of the structural unit for the non-conductive block relative to 1 mole of the structural unit for the conductive block, but is not limited thereto. Alternatively, the conductive block and the non-conductive block may be included at a ratio of 1 weight part to about 3 weight parts of the non-conductive block relative to 1 weight part of the conductive block; for example, at a ratio of 1 weight part to about 2 weight parts of the non-conductive block relative to 1 weight part of the conductive block, but is not limited thereto.

In an example embodiment, each block of the conductive block of the self-assembled block copolymer may have a weight average molecular weight of about 10 kg/mol to about 100 kg/mol, for example; about 10 kg/mol to about 90 kg/mol, for example; about 10 kg/mol to about 80 kg/mol, for example; about 10 kg/mol to about 70 kg/mol, for example; about 10 kg/mol to about 60 kg/mol; for example; about 10 kg/mol to about 50 kg/mol, for example, about 15 kg/mol to about 50 kg/mol, for example, about 20 kg/mol to about 50 kg/mol; for example; about 20 kg/mol to about 45 kg/mol; for example; about 25 kg/mol to about 45 kg/mol; for example, about 25 kg/mol to about 40 kg/mol, about 10 kg/mol to about 35 kg/mol, for example; about 15 kg/mol to about 35 kg/mol, for example, about 15 kg/mol to about 30 kg/mol, for example, about 20 kg/mol to about 30 kg/mol, but is not limited thereto.

Each block of the non-conductive block of the self-assembled block copolymer may have a weight average molecular weight of about 10 kg/mol to about 300 kg/mol; for example, about 10 kg/mol to about 250 kg/mol, for example, about 10 kg/mol to about 230 kg/mol, for example, about 10 kg/mol to about 200 kg/mol; for example, about 10 kg/mol to about 150 kg/mol, for example, about 10 kg/mol to about 130 kg/mol, for example, about 10 kg/mol to about 100 kg/mol, for example, about 10 kg/mol to about 90 kg/mol, for example, about 10 kg/mol to about 80 kg/mol, for example, about 10 kg/mol to about 70 kg/mol, for example, about 10 kg/mol to about 60 kg/mol, for example, about 10 kg/mol to about 50 kg/mol, for example, about 15 kg/mol to about 50 kg/mol, for example, about 20 kg/mol to about 50 kg/mol, for example, about 20 kg/mol to about 45 kg/mol, for example, about 25 kg/mol to about 45 kg/mol, for example, about 25 kg/mol to about 40 kg/mol, about 10 kg/mol to about 35 kg/mol, for example, about 15 kg/mol to about 35 kg/mol, for example, about 15 kg/mol to about 30 kg/mol, or for example, about 20 kg/mol to about 30 kg/mol but is not limited thereto.

The degree of polymerization of the self-assembled block copolymer, which is the total mole number of the structural unit for the conductive block and the structural unit for non-conductive block in the block copolymer, may be easily controlled by adjusting an amount of a reactant for the copolymer, that is, a monomer, and a polymerization time. For example, the degree of polymerization may be controlled variously and may be about 10 to about 1,000, for example, about 30 to about 1,000, for example, 50 to about 1,000, for example, about 50 to about 900, for example, about 50 to about 950, for example, about 50 to about 900, for example, about 50 to about 800, for example, about 100 to about 800, for example, about 120 to about 800, for example, about 120 to about 750, for example, about 130 to about 700, for example, about 150 to about 700, for example, 150 to 650, for example, 150 to 600, for example, about 150 to about 550 and the like, but is not limited thereto. When the degree of polymerization is within the ranges, the self-assembled block copolymer may have a sufficient mechanical strength.

In an example embodiment, the self-assembled block copolymer may be represented by Chemical Formula A:

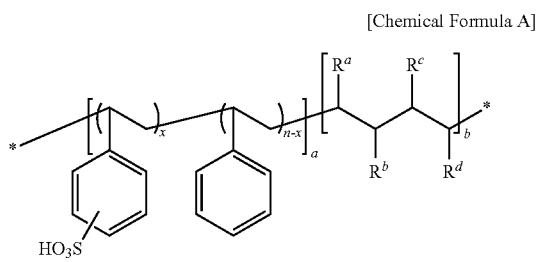

[Chemical Formula A]

In Chemical Formula A, $R^a$ to $R^d$ are independently hydrogen, a C1 to C20 alkyl group, a C2 to C20 alkenyl group, or a C6 to C20 aryl group, a is 10 to 500, b is 10 to 700, x is 0.1 to 0.99, and n is 1.

In an example embodiment, $R^a$ and $R^d$ of Chemical Formula A may be hydrogen, $R^b$ and $R^c$ may independently be hydrogen, a C1 to 010 alkyl group, a C2 to C10 alkenyl group, or a 06 to C12 aryl group, provided that $R^b$ and $R^c$ are not simultaneously hydrogen, a may be 50 to 300, b may be 50 to 500, and x may be 0.2 to 0.9.

In another example embodiment, $R^a$ and $R^d$ of Chemical Formula A may be hydrogen, provided that one of $R^b$ and $R^c$ is a C1 to C4 alkyl group and the other is hydrogen, a may be 50 to 250, b may be 100 to 400, and x may be 0.3 to 0.9.

In an example embodiment, Chemical Formula A may be represented by Chemical Formula B:

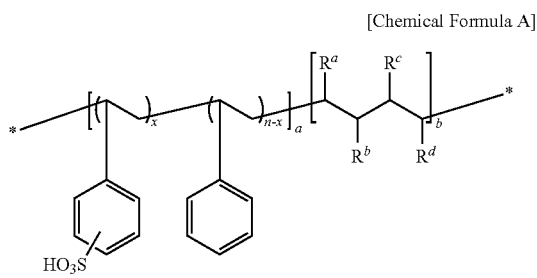

[Chemical Formula A]

In Chemical Formula B, x, n, a, and b are the same as in Chemical Formula A.

The compound to form a single ion conductor with the self-assembled block copolymer may include a compound represented by Chemical Formula 1, a compound represented by Chemical Formula 2, or a combination thereof:

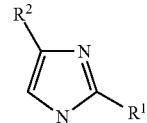

(Chemical Formula 1)

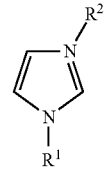

(Chemical Formula 2)

In Chemical Formula 1 and Chemical Formula 2, $R^1$ and $R^2$ are independently hydrogen or a C1 to C30 linear or branched alkyl group, for example, $R^1$ and $R^2$ may independently be hydrogen or a C1 to C20 linear or branched alkyl group, and for another example, $R^1$ and $R^2$ may independently be hydrogen or a C1 to C10 linear or branched alkyl group.

For example, an imidazole compound represented by Chemical Formula 1 or Chemical Formula 2 may include imidazole, 1-methylimidazole, 2-methylimidazole, 1,3-dimethylimidazole, 1-methyl-3-ethylimidazole, 2,4-dimethylimidazole, 2-ethyl-4-methyl imidazole, 2-butyl-4-methyl-imidazole, hexyl-3-methyl imidazole, 2-undecyl imidazole, 2-dodecyl-5-methylimidazole, 2-heptadecyl-4-methylimidazole, and the like, but is not limited thereto. In an example embodiment, the imidazole compound may be imidazole.

FIG. 1 schematically shows that the self-assembled block copolymer and the compound form a single ion conductor in an embodiment. FIG. 1 shows a chemical structural formula that a self-assembled block copolymer including an alkylene block and a polystyrene block substituted with a sulfonic acid group and an imidazole compound form a single ion conductor while the sulfonic acid group provides proton to imidazole.

Meanwhile, the zwitterion included in the polymer electrolyte in an electroactive actuator according to an embodiment increases a dielectric constant of the polymer electrolyte so it is estimated that zwitterion acts to facilitate cations to be dissociated from the single ion conductor and to make the dissociated cations easily transport along with an ionic path which is formed by the conductive block of the self-assembled block copolymer. As found from the Examples and FIG. 8 attached to the specification, the dielectric constant of the polymer electrolyte is significantly increased when the polymer electrolyte includes zwitterions according to one embodiment, compared to the case that the polymer electrolyte includes ionic liquid including both cation and anion. For example, in an example embodiment, the polymer electrolyte including the zwitterion may have a dielectric constant of greater than or equal to about 10, for example greater than or equal to about 15, greater than or equal to about 20, greater than or equal to about 25, greater than or equal to about 30, greater than or equal to about 33, greater than or equal to about 35, greater than or equal to about 40, greater than or equal to about 45, greater than or equal to about 50, greater than or equal to about 55, greater than or equal to about 60, greater than or equal to about 65, or greater than or equal to about 70, or about 76 that is similar to a dielectric constant of water.

Thereby, the zwitterion may be designed considering the thermodynamic compatibility with the conductive block of the self-assembled block copolymer, so that the zwitterion may be present in the ionic path formed of the conductive block. For example, when the conductive block includes a sulfonated polystyrene block, the zwitterion may include a sulfonate group as an anion. In addition, the zwitterions may be designed to include a variety of ammonium groups as a cation moiety considering the compatibility with the cation, but is not limited thereto.

For example, the zwitterion may be represented by Chemical Formula 3:

$R^3$-$L^1$-X  (Chemical Formula 3)

In Chemical Formula 3,
$R^3$ is represented by any one of Chemical Formulae 3-1 to 3-4,

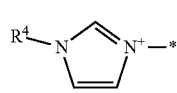  (Chemical Formula 3-1)

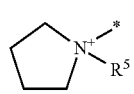  (Chemical Formula 3-2)

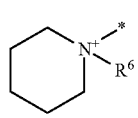  (Chemical Formula 3-3)

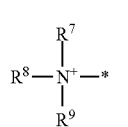  (Chemical Formula 3-4)

In Chemical Formulae 3-1 to 3-4,
$R^4$ to $R^9$ are independently a substituted or unsubstituted C1 to C20 linear or branched alkyl group, for example, a substituted or unsubstituted C1 to C10 linear or branched alkyl group, for example, a substituted or unsubstituted C1 to 06 linear or branched alkyl group, for example, a substituted or unsubstituted 01 to 04 linear or branched alkyl group, $L^1$ is a C1 to C30 alkylene group, a C3 to C30 alkenylene group including at least one double bond, or a C3 to C30 alkynylene group including at least one triple bond, for example, a C1 to C20 alkylene group, a 02 to C20 alkenylene group including at least one double bond, or a C2 to C20 alkynylene group including at least one triple bond, for example, a C1 to C10 alkylene group, a C2 to C10 alkenylene group including at least one double bond, or a C2 to C10 alkynylene group including at least one triple bond, X is $SO_3^-$, $PO_3^-$, or $COO^-$.

In an example embodiment, a zwitterion including a sulfonate group may be 3-(1-methyl-3-imidazolium) propanesulfonate (ZImS) (Chemical Formula 4), 3-[ethyl(dimethyl)ammonio]-1-propanesulfonate (ZAmS) (Chemical Formula 5), 3-(1-methylpiperidinium)-1-propanesulfonate (ZPiS) (Chemical Formula 6) represented by Chemical Formula 4 to Chemical Formula 6, but is not limited thereto.

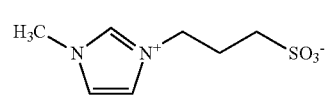  (Chemical Formula 4)

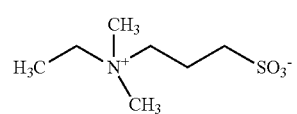  (Chemical Formula 5)

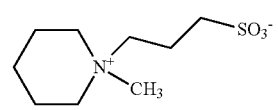  (Chemical Formula 6)

As in above, the zwitterion may be appropriately selected so that the dielectric constant of the polymer electrolyte including the same is greater than or equal to the predetermined level.

In an example embodiment, the compound to form the single ion conductor with the self-assembled block copolymer and the zwitterion may be included in a mole ratio of about 1:3 to about 3:1, for example, about 1:2 to about 2:1, or about 1:1.

In an example embodiment, the polymer electrolyte may be a form of a polymer thin film.

The electrode configured to apply an electric field to the polymer electrolyte may be a single wall carbon nanotube (SWCNT) electrode, a multi-walled carbon nanotube (MW-CNT) electrode, a PEPOT:PSS (poly(3,4-ethylenedioxythiophene) polystyrene sulfonate) conductive polymer electrode, a metal electrode such as a gold (Ag) electrode or a platinum (Pt) electrode, or a combination thereof, but is not limited thereto. When the polymer electrolyte is formed in a thin film, the thin films of the electrodes may be attached onto the both surfaces of the polymer electrolyte thin film to provide an actuator.

In an example embodiment, the electroactive actuator may be formed in a shape that the polymer electrolyte thin film is interposed between a pair of single wall carbon nanotube electrodes. FIG. 3 schematically shows the electroactive actuator obtained according to one embodiment. The TEM image of the polymer electrolyte is shown in FIG. 2.

As shown in TEM image of FIG. 2, the self-assembled block copolymer in the polymer electrolyte membrane has a hexagonal cylinder structure (HEX), and sulfonated polystyrene blocks are darkly stained by $RuO_4$ staining. In addition, as schematically shown in an enlarged circle of FIG. 3, the conductive block in the self-assembled block copolymer provides an ionic channel passing ions and occupies a major part in the polymer electrolyte.

Right side of FIG. 3 shows schematic shape of the actuator obtained by attaching SWCNT electrodes on the both surfaces of the polymer electrolyte membrane shown in left side of FIG. 3. It schematically shows that when the actuator is applied with an electric field, cations are integrated into the ionic channel formed by the conductive block of the self-assembled block copolymer, and zwitterions around them facilitate cations to transport along with the passing channel formed by the conductive block of the self-assembled block copolymer.

As the obtained electroactive actuator according to an embodiment has a quick response time at a low driving voltage, for example, even at a voltage of less than or equal to about 1V and a high responsibility, it may be usefully employed for a small mechanical device including the same, for example, a micro sensor, an artificial muscle, and the like.

The following examples illustrate this disclosure in more detail. These examples, however, are not in any sense to be interpreted as limiting the scope of this disclosure.

EXAMPLES

Synthesis Example 1: Preparation of Self-Assembled Block Copolymer

A self-assembled block copolymer having a block including a styrene structural unit substituted with a sulfonic acid group (PSS: Polystyrene Sulfonate) as a conductive block and a block including methylbutylene (PMB: Polymethyl buthylene) as a non-conductive block is prepared. In order for this, firstly, a block copolymer including styrene unsubstituted with the sulfonic acid group is prepared and sulfonated to provide a block copolymer substituted with sulfonic acid group.

(1) Synthesis of Block Copolymer Including Styrene Unsubstituted with Sulfonic Acid Group Styrene (manufactured by Aldrich) is stirred using $CaH_2$ for 12 hours, and distilled by n-butyllithium under vacuum for 6 hours to be purified. Isoprene (manufactured by Aldrich) is treated with dibutylmagnesium for 3 hours and treated with n-butyllithium for 6 hours, Cyclohexane which is distilled by n-butyllithium is used as a polymerization solvent.

20 g of styrene is polymerized using an initiator of 2.88 mL of sec-butyllithium at 45° C. for 4 hours, and then added with 20 g of isoprene and polymerized at the same temperature for 4 hours to provide a $S_{153}I_{313}$ block copolymer including 153 mole of styrene and 313 mole of isoprene. Then the $S_{153}I_{313}$ copolymer is saturated using a 2 L Parr batch reactor at 80° C., 420 psi under a presence of uniform Ni—Al catalyst, and the catalyst is removed by intensely stirring the reacted mixture with 10% of citric acid water to synthesize a $S_{153}I_{313}$ block copolymer, in which isoprene is selectively hydrogenized, and sulfonic acid group is not substituted.

(2) Synthesis of Block Copolymer Including Styrene Substituted with Sulfonic Acid Group 40 mL of 1,2-dichloroethane and 1 g of $S_{153}I_{313}$ block copolymer obtained from (1) are introduced into a 100 mL 3-neck flask mounted with a funnel and a condenser. The mixture is heated and stirred at a temperature of 40° C. under the $N_2$ blanket.

1.8 mL of anhydrous acetic acid and 5.4 mL of dichloroethane are input into a closed and sealed round-bottomed flask where $N_2$ is removed to provide acetic sulfate. The solution is cooled to 0° C. and then added with 0.5 mL of 96% sulfuric acid.

The acetic sulfate is instantly moved to a flask containing a mixture of the $S_{153}I_{313}$ block copolymer and dichloroethane at a temperature of 40° C. and added with 20 mL of 2-propanol and reacted for 15 minutes. A copolymer is purified from the reaction mixture using a cellulose dialysis layer having a fractionating molecular weight (VWR) of 3.5 kg/mol, By vacuum-drying the purified copolymer at 50° C. for 7 days, it synthesize a $S_{153}I_{313}$ (60) block copolymer including styrene which is substituted with sulfonic acid group in 60 mol % based on the mole number of the total styrene in the copolymer.

Additional self-assembled block copolymers are prepared in accordance with the same procedure as in the Synthesis Example, except that the degree of sulfonation (DS) is variously adjusted within a range from about 20 mol % to about 90 mol %.

In addition, the degree of polymerization of the block copolymer may be controlled by adjusting the amounts of styrene and isoprene and the polymerization time from the Synthesis Example, and additional self-assembled block copolymers are prepared by variously adjusting the degree of polymerization within a range from about 100 to about 700.

Synthesis Example 2: Preparation of Polymer Electrolyte

Polymer electrolytes according to Examples 1 to 3 are prepared by adding imidazole and zwitterion into the self-assembled block copolymer obtained from Synthesis Example 1.

Specifically, 0.1 g of the self-assembled block copolymer obtained from Synthesis Example 1 is dissolved into 5 ml of methanol-THF (Tetrahydrofuran) co-solvent and added with imidazole (Im) at a mole ratio of 1:4 of imidazole to sulfonic acid of the block copolymer and reacted by stirring the same for 12 hours to provide a single ion conductor of the copolymer and imidazole shown in FIG. 1.

Into the solution including the self-assembled block copolymer-imidazole ion conductor, each of three zwitterions, which is 3-(1-methyl-3-imidazolium) propanesulfonate (ZImS) (represented by Chemical Formula 4), 3-[ethyl(dimethyl)ammonio]-1-propanesulfonate (ZAmS) (represented by Chemical Formula 5), or 3-(1-methylpiperidinium)-1-propanesulfonate (ZPiS) (represented by Chemical Formula 6), is added at the same mole number as the added imidazole to provide a polymer electrolyte according to Examples 1 to 3, respectively. Specifically, each zwitterion is preliminarily dissolved in a methanol solvent in a concentration of 10 wt % and then added into the solution including the block copolymer-imidazole ion conductor and reacted by stirring for 12 hours.

As the zwitterions commonly include a sulfonate group as an anion component, it is estimated to have good thermodynamic compatibility with polystyrene block substituted with sulfonic acid group of the self-assembled block copolymer. The kinds of cations included in the zwitterions are different from each other, so it is believed to control the interaction with the polystyrene block substituted with sulfonic acid group which is a conductive block of the self-assembled block copolymer, by changing the kind of cation.

Furthermore, as Comparative Example, an ionic liquid (Im/TFSI) including an imidazole (Im) compound and bis(trifluoromethane sulfonyl)imide (TFSI) is mixed with the self-assembled block copolymer to provide a polymer electrolyte. Specifically, 0.1 g of the self-assembled block copolymer obtained from Synthesis Example 1 is dissolved into 5 ml of methanol-THF (Tetrahydrofuran) co-solvent and added with imidazole (Im) and bis(trifluoromethane sulfonyl)imide (TFSI) at a mole ratio of 1:1 based on the sulfonic acid of the block copolymer and reacted by stirring for 12 hours to provide a polymer electrolyte.

Meanwhile, as a control group, the single ion conductor is formed with only the prepared self-assembled block copolymer and imidazole without adding the ionic liquid or zwitterion to provide a polymer electrolyte (w/o).

In order to compare the ionic interaction, for example, a dipole moment and the like of the obtained polymer electrolyte and ionic complexes, it is performed with ab initio calculations using a B3LYP exchange-correlation functional based on a density functional theory, and the results are shown in the following Table 1. The results shown in the following Table 1 show a binding energy at 0 K when each geometry of the polymer electrolyte and the ionic complex is optimized.

TABLE 1

| Type of Interaction | | Binding Energy (KJ/mol)[a] | Type of Ionic Complex | Dipole Moment (Debye) |
|---|---|---|---|---|
| Im/Polymer | Im/$C_6H_5SO_3^-$ | 459.3 | Im/$C_6H_5SO_3^-$/ZImS | 12.66 |
| Im/Zwitterion | Im/ZImS | 307.0 | Im/$C_6H_5SO_3^-$/ZAmS | 7.30 |
|  | Im/ZAmS | 299.7 |  |  |
|  | Im/ZPiS | 321.6 |  |  |
| Zwitterion/Polymer | ZImS/$C_6H_5SO_3^-$ | 229.9 | Im/$C_6H_5SO_3^-$/ZPiS | 7.46 |
|  | ZAmS/$C_6H_5SO_3^-$ | 227.4 |  |  |
|  | ZPiS/$C_6H_5SO_3^-$ | 217.2 |  |  |

[a]All calculations were performed using a DFT Exchange-Correlation Functional, B3LYP.

Although both the self-assembled block copolymer and zwitterions have the identical sulfonate group, imidazole is more strongly bonded with the sulfonic acid group of the polymer than the zwitterions. It is understood that imidazole is more actively interacted with PSS between the polystyrene block (PSS) substituted with the sulfonic acid group and zwitterions, regardless of the kind of cation of zwitterions. In addition, Im/PSS/ZImS has the higher dipole moment than other ionic complexes (Im/PSS/ZAmS, Im/PSS/ZPiS).

Preparation Example: Preparation of Polymer Electrolyte Membrane and Fabrication of Actuator Including Prepared Polymer Electrolyte Membrane Polymer electrolytes obtained from Synthesis Example 2 are each fabricated to a polymer electrolyte membrane. Specifically, the polymer electrolyte solution obtained from Synthesis Example 2 is casted on a TEFLON (tetrafluoroethylene) substrate at room temperature under the argon (Ar) gas, and vacuum-dried at room temperature for 5 days to provide a polymer membrane having a thickness of about 60 μm to 100 μm.

The obtained polymer electrolyte membrane is interposed between single wall carbon nanotubes (SWCNT) having a thickness of 10 mm through a hot press to provide a 3-layered actuator as shown in FIG. 3. The obtained actuator strip has a size of 2 mm×11 mm×80 μm. FIG. 4 is a SEM (Scanning Electromicroscopy) image showing a cross-sectional surface of the actuator, Meanwhile, the structure of the self-assembled block copolymer in the polymer electrolyte membrane is confirmed by a Transmission electron microscope (TEM), and the result is shown in FIG. 2. As show in FIG. 2, the self-assembled block copolymer in the polymer electrolyte membrane has a hexagonal cylinder structure (HEX), and it is confirmed that the sulfonated polystyrene blocks are darkly stained by $RuO_4$ staining.

As schematically shown in an enlarged circle of FIG. 3, the conductive block in the self-assembled block copolymer provides an ionic channel passing ions and occupies a major part in the polymer electrolyte. In addition, FIG. 3 schematically shows that SWCNT electrodes are attached on the both surfaces of the polymer electrolyte membrane shown in left side to provide an actuator. Cations and zwitterions are integrated in the place where the conductive block of the self-assembled block copolymer forms the ionic channel when applying electric field, in the actuator shown in the right side of FIG. 3.

FIG. 5 shows small-angle X-ray scattering (SAXS) graphs of the obtained polymer electrolytes measured at a room temperature. As shown in the graphs, all the self-assembled block copolymers show the same HEX structure even in the cases of including different kinds of the ionic complexes used for fabricating the polymer electrolyte, but the arrangement degree of the self-assembled block copolymer or the domain size (sizes of conductive block and non-conductive block) is changed depending upon the kind of the added ionic complex. The sample which is well arranged in the largest part is the case of adding ZImS as zwitterion according to Example 1, which has the highest difference of the domain sizes. It means that zwitterions of ZImS and imidazole (Im) compound have the highest thermodynamic compatibility with a polystyrene block substituted with sulfonic acid group. The representative bragg peaks exhibiting that the polymer electrolyte including ZImS has a HEX structure are shown at q*, $\sqrt{3}$q*, $\sqrt{4}$q*, $\sqrt{7}$q*, $\sqrt{9}$q*, $\sqrt{12}$q*, (↓) in the drawing.

Evaluation: Characteristics of Electroactive Actuator

Actuators including polymer electrolyte membranes including each ionic complex obtained from Synthesis Example 2, specifically, actuators including polymer electrolytes according Examples 1 to 3 including each of ZImS, ZAmS, and ZPiS as an imidazole compound and zwitterion in addition to the self-assembled block copolymer obtained from Synthesis Example 1; an actuator according to Comparative Example including polymer electrolyte (Im/TFSI) including imidazole (Im) and ionic liquid TFSI in addition to the block copolymer; and an actuator as a control obtained from polymer electrolyte (w/o) with only imidazole in the self-assembled block copolymer, are evaluated for the performance as follows:

(1) Measurement of Displacement and Ion Conductivity of Actuator

Each of the actuators is applied with a square-wave voltage of ±3 V in a period of 20 seconds, and the displacement δ (mm) of the actuator depending upon time is measured, and the results are shown in FIG. 6, The displacement δ (mm) is determined by measuring each a distance to which the tip of the actuator moved when applying +3 V and a distance to which the tip of the actuator moved in an opposite direction when applying −3V. In addition, a strain ε (%) shown at y-axis in the right side of the graph means a bending strain calculated based on the displacement at a frequency of 0.025 Hz.

From FIG. 6, it is understood that the performance of actuator is significantly improved in the cases of actuators including polymer electrolytes according to Examples 1 to 3 added with zwitterion of ZImS, ZAmS, and ZPiS, respectively. In all three cases, the response time reaching the equilibrium is significantly decreased compared to Comparative Example including Im/TFSI or a control including only imidazole (w/o). Particularly, Example 1 that ZImS is added to the polymer electrolyte has δ value of greater than 14 mm (e=1.8%), and the time to reach the equilibrium is also significantly reduced. It means that the ion motion is significantly fast when providing an electric stimulus.

FIG. 7 shows images of the bending shapes of the actuator when the actuator including the polymer electrolyte added with zwitterion of ZImS according to Example 1 is applied with ±3V and then waited for 1 second.

On the other hand, the control actuator (w/o) including polymer electrolyte in which only imidazole is added to the block copolymer shows the very low displacement of 4.5 mm (e=0.6%) and needs greater than or equal to 20 seconds until reaching the equilibrium potential, which means that the imidazolium cation is in sufficiently diffused in the polymer electrolyte.

Meanwhile, the actuator obtained by adding ionic liquid of Im/TFSI increases δ in greater than or equal to 40% compared to the case added no ionic complex. It appears that TFSI anion acts as a plasticizer in the polymer electrolyte to lower the glass transition temperature and to make the polymer membrane soft, so that the actuator is well bent. However, because of this, it may deteriorate the durability of the actuator and delay the response time.

It is estimated that the reason why the strains of the actuators including zwitterion-added polymer electrolytes are different from each other relates to the ion conductivity in the polymer electrolyte. As shown in FIG. 8, the actuator (w/o) obtained from only imidazole (Im)-added polymer electrolyte has a very low ion conductivity. Thus in a case of including the polymer electrolyte added with ionic liquid Im/TFSI, the ion conductivity may be improved since both cation and anion are transported. However, the case of actuator including the polymer electrolyte according to Example 1 added with zwitterion of ZImS shows the higher ion conductivity than the case added with the ionic liquid of Im/TFSI. This phenomenon is opposite to the common sense that zwitterion has no influence on the ion conductivity, as the zwitterion itself is electrically neutral, so it is a totally unexpected result.

(2) Measurement of Broadband Dielectric Spectroscopy

In order to find influence of zwitterion on the dielectric response in the polymer electrolyte, a broadband dielectric spectroscopy is carried out.

In the graph of FIG. 9, static dielectric constants ($\varepsilon_s$) of each polymer electrolytes added with zwitterions, a static dielectric constant of electrolyte added with ionic liquid of Im/TFSI, and a static dielectric constant of the electrolyte obtained by adding only imidazole (w/o) into the copolymer are shown.

The polymer electrolyte added with only imidazole (w/o) has the lowest static dielectric constant of 7; and a static dielectric constant of the polymer electrolyte added with ionic liquid Im/TFSI is increased to 10. When adding zwitterions of ZPiS, ZAmS, and ZImS, the dielectric constants of the polymer electrolytes are improved to 11, 33 and 76, respectively, which corresponded to the strain tendency of the actuators shown in (1). It means that the charge density in the polymer electrolyte is increased by adding zwitterion, so that imidazolium cation is easily dissociated.

Without being bound by any particular theory, it is understood that the reason why the polymer electrolyte actuator doped with imidazole has an excellent performance and a fast response time by adding zwitterion of ZImS is that the dielectric constant of the polymer electrolyte is significantly enhanced; such that cations can be very rapidly transported through the well formed ionic channels. Accordingly; in order to find out the mechanism; two actuators including polymer electrolyte according to Example 1 added with zwitterion of ZImS, as a representative example, and a polymer electrolyte according to Comparative Example added with ionic liquid of Im/TFSI are compared.

(3) Potentiostatic Polarization Test

In order to observe the single conductor characteristics of the block copolymer doped with imidazole together with ZImS or Im/TFSI, the potentiostatic polarization test is carried out to measure a cation transference number ($T_+$). The current density ($I_0$, $I_s$) and the interfacial resistance ($R_0$, $R_s$) before and after the polarization are measured, and $T_+$ is calculated through the following Formula:

$$T_+ = \frac{I_S(\Delta V - I_0 R_0)}{I_0(\Delta V - I_S R_S)}$$

FIGS. 10 and 11 show current density profiles of the actuator including ZImS according to Example 1 and the actuator including Im/TFSI according to Comparative Example, respectively, while being polarized for 90 minutes. The electrolyte samples are preliminarily polarized by a DC voltage of 50V and measured for a current density, Both the actuators show a steady state plateau within 30 minutes, but there are remarkable difference between the actuator including ZImS and the actuator including Im/TFSI. That is, decay is to gradually occurred in the actuator including ZImS, while decay is rapidly occurred in the actuator added with Im/TFSI. When the transference number of cation ($T_+$) is calculated thereby, ZImS has the transference number of 0.88, which is considerably higher than 0.42 in Im/TFSI (corresponding to the value generally shown in the polymer electrolyte added with ionic liquid), Furthermore, the force generated by driving the novel actuator draws attentions.

Referring to FIG. 12, the actuator including ZImS generates force of 0.3 mN within 0.5 seconds under a driving voltage of 3V. This is the force larger in 3 times of the Im/TFSI actuator according to Comparative Example and is also considerably fast in a view of response time. If Young's modulus (E) of the actuator is inferred from the following Formula with applying an elastic mechanical model, the actuator including ZImS has a Young's modulus of 649 MPa, but the actuator added with Im/TFSI has 259 MPa, P refers to a generated force, 5 refers to a displacement, L refers to an actuator length, b refers to an actuator width, and h refers to an actuator thickness.

$$E = \frac{4PL^3}{\delta b h^3}$$

(4) Tests of Displacement and Strain of ZImS-Included Actuator at Low Driving Voltage and High Frequency Whether the obtained actuators can be driven at a low voltage is examined. Most of ionic polymer actuator have a problem in that the strain is rapidly decreased when decreasing a voltage or increasing a driving frequency, which works as a deterrent to use the same as a practical device. Thus many researches have been studied to solve the problems.

FIG. 13 shows a displacement and a strain of the actuator added with ZImS, which is responds under a driving voltage of ±3V, ±2V, ±1V and a frequency of 0.5 Hz, and 10 Hz. It is understood that a high displacement (2 mm) is shown even at 1V, and 10 Hz (50 ms period), which is the best results for the actuators reported so far. In addition, the strain is shown in a little difference between 0.5 Hz and 10 Hz under a low voltage, which is amazing result.

FIG. 14 shows graphs comparing displacements and strains of the actuator including zwitterions of ZImS and the actuator including ionic liquid of Im/TFSI at a low driving voltage. As shown in FIG. 14, the two actuators show a strain difference of greater than or equal to 3 times under ±1V and also show the different results in response time. In addition, the ZImS-included actuator does not show a back relaxation even after driving for greater than or equal to 200 seconds, so it is understood that the ion transport and accumulation are well occurred when applying the electric field.

Meanwhile, in order to more concretely measure the response time, it is examined using a laser displacement sensor. As shown in FIG. 15, the zwitterion ZImS-included actuator has a very short first response time of 20 ms under 1V and is moved for 1 mm only in 60 ms and reaches the equilibrium state only in 190 ms. On the other hand, the ionic liquid Im/TFSI-included actuator needs about 5 seconds to reach the equilibrium in the displacement.

The zwitterion ZImS-included actuator has excellent durability in addition to the fast and high strain under the low driving voltage. When the actuator is observed for a displacement with applying a driving voltage of ±1V in a period of 50 ms, it well works with almost no changes in a lapse of 20,000 cycles. FIG. 16 shows the working graph.

SUMMARY

An embodiment provides an actuator in a single ion conductor in which only imidazolium cation may be transferred, by adding zwitterion into a block copolymer substituted with sulfonic acid group and doped with imidazole to provide a polymer electrolyte; and applying the same to the actuator. According to theoretical calculation results, it is understood that the interaction between the polymer matrix and the imidazolium cation is stronger than the interaction between zwitterions and imidazolium cation. When Zwitterion is added among ionic channels in the well-arranged polymer electrolyte, it is estimated to enhance a polarity of the polymer electrolyte like water and also to increase a charge density. Although zwitterion itself is electrically neutral so does not influence on the ion conductivity, it may increase a dielectric constant and accelerate an ion dissociation degree, so as to enhance an ion conductivity in greater than or equal to about 300 times and to provide a high cation transference number (0.88). In addition, a novel actuator according to an embodiment shows a large displacement such as about 8 mm, about 5 mm, about 2 m even in a short driving period of 50 ms under a low driving voltage such as 3 V, 2 V, 1 V, respectively, and also has a very fast response time enough to reach the equilibrium in the displacement within only 190 ms. Furthermore, it does not show a back relaxation even if driving for greater than or equal to about 200 seconds. Considering that the conventional actuator including the ionic liquid needs several seconds to reach the equilibrium in the displacement and also shows the back relaxation, it is confirmed that the actuator according to one embodiment may have superior characteristics in the various aspects.

Even when comparing with the conventional actuators reported so far, the actuator according to an embodiment may be driven by a relatively considerably low power consumption, so it is expected to apply for a soft robotics, an artificial muscle, a bio-mimic devices and the like in the future.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroactive actuator, comprising
a polymer electrolyte and an electrode configured to apply an electric field to the polymer electrolyte, wherein the polymer electrolyte includes a self-assembled block copolymer including a conductive block and a non-conductive block, a compound to form a single ion conductor with the self-assembled block copolymer, and a zwitterion.

2. The electroactive actuator of claim 1, wherein the self-assembled block copolymer has a lamellar (LAM) structure, a hexagonal cylinder (HEX) structure, a gyroid (GYR) hexagonal cylinder (HEX) structure, a gyroid (GYR) structure, or a combination thereof.

3. The electroactive actuator of claim 1, wherein the self-assembled block copolymer has a hexagonal cylinder structure.

4. The electroactive actuator of claim 1, wherein the self-assembled block copolymer includes styrene blocks of which at least a part is sulfonated as the conductive block.

5. The electroactive actuator of claim 1, wherein the self-assembled block copolymer includes a sulfonated styrene block as the conductive block and a degree of sulfonation is greater than or equal to about 10 mol % based on total moles of the structural units of the styrene block.

6. The electroactive actuator of claim 1, wherein the self-assembled block copolymer includes a block including an alkylene repeating unit as the non-conductive block.

7. The electroactive actuator of claim 1, wherein each conductive block of the self-assembled block copolymer has a weight average molecular weight of about 10 kg/mol to about 100 kg/mol.

8. The electroactive actuator of claim 1, wherein the compound to form the single ion conductor with the self-assembled block copolymer includes a compound represented by Chemical Formula 1, a compound represented by Chemical Formula 2, or a combination thereof:

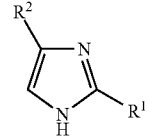

(Chemical Formula 1)

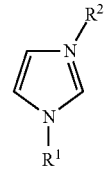

(Chemical Formula 2)

wherein, in Chemical Formula 1 and Chemical Formula 2, $R^1$ and $R^2$ are independently hydrogen or a C1 to C30 linear or branched alkyl group.

9. The electroactive actuator of claim 1, wherein the zwitterion includes a sulfonic acid group as an anion component.

10. The electroactive actuator of claim 1, wherein the zwitterion is represented by Chemical Formula 3:

$$R^3\text{-}L^1\text{-}X \quad \text{(Chemical Formula 3)}$$

wherein, in Chemical Formula 3,
R$^3$ is represented by any one of Chemical Formulae 3-1 to 3-4,

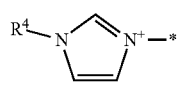
(Chemical Formula 3-1)

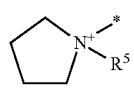
(Chemical Formula 3-2)

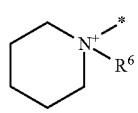
(Chemical Formula 3-3)

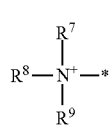
(Chemical Formula 3-4)

wherein, in Chemical Formulae 3-1 to 3-4,
R$^4$ to R$^9$ are independently a substituted or unsubstituted C1 to C10 alkyl group,
L$^1$ is a C1 to C30 alkylene group, a C2 to C30 alkenylene group including at least one double bond, or a C2 to C30 alkynylene group including at least one triple bond, and
X is SO$_3^-$, PO$_3^-$, or COO$^-$.

11. The electroactive actuator of claim 1, wherein the zwitterion is at least one represented by Chemical Formula 4 to Chemical Formula 6:

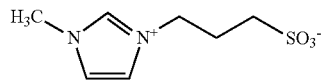
(Chemical Formula 4)

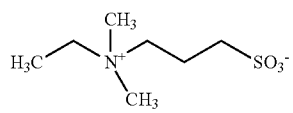
(Chemical Formula 5)

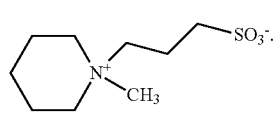
(Chemical Formula 6)

12. The electroactive actuator of claim 1, wherein the compound to form the single ion conductor with the self-assembled block copolymer and the zwitterion are included in a mole ratio of about 1:3 to about 3:1 in the polymer electrolyte.

13. The electroactive actuator of claim 1, wherein the polymer electrolyte has a dielectric constant of greater than or equal to about 10.

14. The electroactive actuator of claim 1, wherein the polymer electrolyte has a form of a polymer thin film.

15. The electroactive actuator of claim 1, wherein the electrode configured to apply an electric field to the polymer electrolyte is a single wall carbon nanotube (SWCNT) electrode, a multi-walled carbon nanotube (MWCNT) electrode, a PEPOT:PSS (poly(3,4-ethylenedioxythiophene) polystyrene sulfonate) conductive polymer electrode, a metal electrode, or a combination thereof.

16. A mechanical device comprising the electroactive actuator of claim 1.

17. The mechanical device of claim 16, wherein the mechanical device is a sensor or an artificial muscle.

18. A polymer electrolyte comprising a self-assembled block copolymer including a conductive block and a non-conductive block, a compound to form a single ion conductor with the self-assembled block copolymer, and a zwitterion, wherein a dielectric constant of the polymer electrolyte is greater than or equal to about 10.

19. The polymer electrolyte of claim 18, wherein the self-assembled block copolymer includes styrene blocks of which at least a part is sulfonated as the conductive block and a block including an alkylene repeating unit as the non-conductive block, and has at least one structure selected from a lamellar (LAM) structure, a hexagonal cylinder (HEX) structure, a gyroid (GYR) hexagonal cylinder (HEX) structure, and a gyroid (GYR) structure.

20. The polymer electrolyte of claim 19, wherein the compound to form the single ion conductor with the self-assembled block copolymer comprises a compound represented by Chemical Formula 1, a compound represented by Chemical Formula 2, or a combination thereof:

(Chemical Formula 1)

(Chemical Formula 2)

wherein, in Chemical Formula 1 and Chemical Formula 2, R$^1$ and R$^2$ are independently hydrogen or a C1 to C30 linear or branched alkyl group.

* * * * *